United States Patent

Kelly et al.

[11] Patent Number: 5,801,573
[45] Date of Patent: Sep. 1, 1998

[54] PROTECTED SWITCH HAVING A POWER SEMICONDUCTOR DEVICE

[75] Inventors: Brendan P. Kelly; Royce Lowis, both of Stockport, England

[73] Assignee: U.S. Philips Corporation, New York, N.Y.

[21] Appl. No.: 884,104

[22] Filed: Jun. 27, 1997

Related U.S. Application Data

[63] Continuation of Ser. No. 540,520, Oct. 10, 1995, abandoned.

[30] Foreign Application Priority Data

Oct. 12, 1994 [GB] United Kingdom ............ 9420572

[51] Int. Cl.$^6$ ............................................. H03K 17/687
[52] U.S. Cl. ............... 327/434; 327/327; 327/309; 327/313; 327/480
[58] Field of Search ........................ 327/427, 434, 327/309, 480, 312, 313, 327; 307/126

[56] References Cited

U.S. PATENT DOCUMENTS

| | | | |
|---|---|---|---|
| 4,136,354 | 1/1979 | Dobkin. | |
| 4,667,121 | 5/1987 | Fay et al. | 327/427 |
| 4,893,158 | 1/1990 | Mihara et al. | |
| 5,018,041 | 5/1991 | Szepesi | 361/18 |
| 5,079,456 | 1/1992 | Kotowski et al. | 327/538 |
| 5,084,668 | 1/1992 | Kotowski et al. | 323/315 |
| 5,272,392 | 12/1993 | Wong et al. | 327/109 |
| 5,396,117 | 3/1995 | Housen et al. | 327/480 |
| 5,422,593 | 6/1995 | Fujihara | 327/427 |
| 5,423,471 | 6/1995 | Majumdar et al. | 327/313 |
| 5,500,619 | 3/1996 | Miyasaka | 327/480 |

FOREIGN PATENT DOCUMENTS

0139998  4/1987  European Pat. Off..
0557850A2  9/1993  European Pat. Off. ....... H03K 17/08

*Primary Examiner*—Terry Cunningham
*Attorney, Agent, or Firm*—Steven R. Biren

[57] ABSTRACT

A protected switch has a power semiconductor device (P) having first and second main electrodes (D and S) for coupling a load (L) between first (2) and second (3) voltage supply lines, a control electrode (G) coupled to a control voltage supply line (4) and a sense electrode (S1) for providing in operation of the power semiconductor device a sense current that flows between the first (d) and sense electrodes (S1) and is indicative of the current that flows between the first (D) and second (S) main electrodes. A control arrangement (S) has a sense resistance (R4) coupled to the sense electrode (S1) and across which a sense voltage is developed by the sense current ($I_3$). A control semiconductor device (M3) has its main electrodes coupled between the control electrode (G) and the second (S) main electrode of the power semiconductor device (P). A semiconductor device (M2) has one (d) of its main electrodes coupled to the control electrode (g) of the control semiconductor device (M3) and the other (s) to the sense resistance (R4). A reference arrangement (50) provides a biasing voltage $V_b$ for the control electrode (g) of the semiconductor device (M2) to cause the semiconductor device (M2) to conduct sufficiently to cause the control semiconductor device (M3) to be non-conducting until the sense voltage reaches a reference voltage determined by the biasing voltage when the semiconductor device (M2) becomes less conducting, causing the control semiconductor device (M3) to start to conduct, so reducing the voltage at the control electrode (G) of the power semiconductor device (P) and thus reducing the current through the power semiconductor device (P).

16 Claims, 5 Drawing Sheets

PROTECTED SWITCH HAVING A POWER SEMICONDUCTOR DEVICE

This is a continuation of application Ser. No. 08/540,520, filed Oct. 10, 1995, now abandoned.

BACKGROUND OF THE INVENTION

This invention relates to a protected switch.

U.S. Pat. No. 4,893,158 describes a protected switch in the form of a power semiconductor device having first and second main electrodes for coupling a load between first and second voltage supply lines, a control electrode coupled to a control voltage supply line and a sense electrode for providing in operation of the device a sense current that flows between the first and sense electrodes and is indicative of the current that flows between the first and second main electrodes. A control semiconductor device has first and second main electrodes coupled between the control electrode and the second main electrode of the power semiconductor device and a control electrode coupled to the sense electrode of the power semiconductor is coupled to via a current path provided by a sense resistance to the second main electrode of the power semiconductor device so that, when the current provided by the sense electrode reaches a given current and so develops sufficient voltage across the sense resistance, the control semiconductor device is rendered conducting to provide a conductive path between the control and the second main electrodes of the power semiconductor device to regulate the operation of, in particular to regulate the current through, the power semiconductor device.

In the protected switch described in U.S. Pat. No. 4,893, 158, the control semiconductor device effectively forms an inverter with the series gate resistance Ri of the power semiconductor device, the sensed current through the sense resistor Rs determining the gate drive. This results in a low gain which makes the regulated current of the power semiconductor device imprecise and dependent on the external gate drive, the value of the gate series resistance Ri and process parameters. Also, the negative temperature coefficient of the control semiconductor device at low threshold voltages (that is close to the point at which the control semiconductor device becomes conducting) and the typically positive temperature coefficient of the sense resistance results in an overall negative temperature coefficient for the limiting value of the output current of the circuit. In addition, where, as described in U.S. Pat. No. 4,893,158, the sense electrode is provided by a control MOS device made up of one or more cells substantially identical to the cells of the main power semiconductor device, the ratio between the current through the power semiconductor device and the current supplied through the relatively high value sense resistance Rs from the sense electrode will be a function of the process-dependent electrical parameters of the power semiconductor device and the control or sense cell as well as their geometrical ratio because the two devices will be operating with dissimilar voltages between their control and second main electrodes and between their first and second main electrodes. This makes the operation of the switch difficult to predict and results in poor precision. Furthermore, when the voltage between the first and second main electrodes of the power semiconductor device is low, the circuit may not function because the resultant voltage at the control electrode of the control semiconductor device may not be sufficient to turn on the control semiconductor device when required. As the voltage between the first and second main electrodes of the power semiconductor device rises, then the circuit will enter a negative resistance region as it begins to operate which may result in oscillatory action with certain types of loads such as inductors.

SUMMARY OF THE INVENTION

According to the present invention, there is provided a protected switch comprising a power semiconductor device having first and second main electrodes for coupling a load between first and second voltage supply lines, a control electrode coupled to a control voltage supply line and a sense electrode for providing in operation of the power semiconductor device a sense current that flows between the first and sense electrodes and is indicative of the current that flows between the first and second main electrodes, and a control arrangement comprising a sense resistance coupled to the sense electrode and across which a sense voltage is developed by the sense current, a control semiconductor device having first and second main electrodes coupled between the control electrode and the second main electrode of the power semiconductor device and a control electrode, a semiconductor device having first and second main electrodes and a control electrode and having one of its first and second main electrodes coupled to the control electrode of the control semiconductor device and the other of its first and second main electrodes coupled to the sense resistance, and reference means for providing a biasing voltage for the control electrode of the semiconductor device to cause the semiconductor device to conduct sufficiently to cause the control semiconductor device to be nonconducting until the sense voltage reaches a reference voltage determined by the biasing voltage when the semiconductor device becomes less conducting and causes the control semiconductor device to start to conduct, so reducing the voltage at the control electrode of the power semiconductor device and thus reducing the current through the power semiconductor device.

A protected switch in accordance with the invention enables a higher gain to be achieved so that the current to which the power semiconductor device is limited, that is the regulated current, is less dependent on the series gate resistance or drive voltage of the power semiconductor device. Moreover, the occurrence of a negative resistance region can be avoided or at least inhibited and the other above mentioned problems with the protected switch described in U.S. Pat. No. 4,893,158 should be overcome or at least mitigated. Furthermore, because the sense electrode may be coupled so that the semiconductor device does not have to carry the sense current, there is no need for the biasing means and the semiconductor device to be formed so as to be able to carry high currents comparable with the sense current. Moreover, in contrast to the protected switch described in U.S. Pat. No. 4,893,158, the sense resistance may be of a low value compared to the on state resistance of the sense current path.

The reference means may comprise a further semiconductor device having first and second main electrodes and a control electrode, the control electrode of the further semiconductor device being coupled to one of the first and second main electrodes of the further semiconductor device and to the control electrode of the semiconductor device. The semiconductor devices may be transistors. Generally, one of the first and second main electrodes of the further semiconductor device is coupled via a first resistance to a further voltage supply line, the one main electrode of the semiconductor device is coupled to the voltage supply line by a second resistance and the other one of the first and second main electrodes of the semiconductor device and the further semiconductor device are coupled by the sense resistance and a third resistance, respectively, to one of the first and second main electrodes of the power semiconductor device.

However, any other suitable reference means may be used to bias the control electrode of the semiconductor device at a suitable constant biasing voltage to provide the desired current at its first main electrode. For example externally applied biases may be used which have been deliberately chosen to provide a positive or negative temperature coefficient where such a feature is desired in operation of the circuit.

The control voltage supply line may be coupled to the further voltage supply line. As another possibility, the further voltage supply line may comprise an auxiliary voltage supply line separate from the control voltage supply line. The use of an auxiliary voltage supply line makes the given current value far less dependent on the voltage on the control voltage supply line. Also, it avoids the problems which might arise where the drive impedance for the control voltage supply line is high (for example where the drive is provided by a charge pump circuit) such that increasing the loading on the control voltage supply line during current limiting would cause the voltage on the line to fall and thus reduce the value of the given current.

Means may be provided for detecting when the control semiconductor device is conducting. Such detecting means may comprise a detecting resistance coupled in series with the control semiconductor device and means for comparing the voltage across the detecting resistance with a further reference voltage. The comparing means may comprise another semiconductor device having one of its first and second main electrodes coupled to the control gate of an output semiconductor device and the other of its first and second main electrodes coupled to the detecting resistance and further reference means for providing a further biasing voltage for the control electrode of the said other semiconductor device causing the said other semiconductor device to conduct sufficiently for the output semiconductor device to be non-conducting until the voltage across the detecting resistance reaches a further reference voltage determined by the further biasing voltage when the said other semiconductor device becomes less conducting and causes the output semiconductor device to start to conduct so providing a signal indicating that the control semiconductor device is conducting.

The control arrangement may be carried by the semiconductor body carrying the power semiconductor device.

The power semiconductor device may comprise a first plurality of device cells coupled in parallel between the first and second main electrodes and a second smaller plurality of similar device cells coupled in parallel between the sense electrode and the first main electrode of the power semiconductor device.

The power semiconductor device may, for example, comprise a power MOSFET structure. For example, the power semiconductor device may be a power MOSFET or may be a device such as an insulated gate bipolar transistor or other mixed bipolar MOSFET device incorporating a power MOSFET structure. Of course, the power semiconductor device could be a power bipolar device, such as a power bipolar transistor, of appropriate structure.

Embodiments of the present invention will now be described, by way of example, with reference to the accompanying drawings, in which.

It should of course be understood that the drawings are not to scale and that like reference numerals are used throughout text to refer to like parts.

DESCRIPTION OF THE PREFERRED EMBODIMENTS

Figure 1:
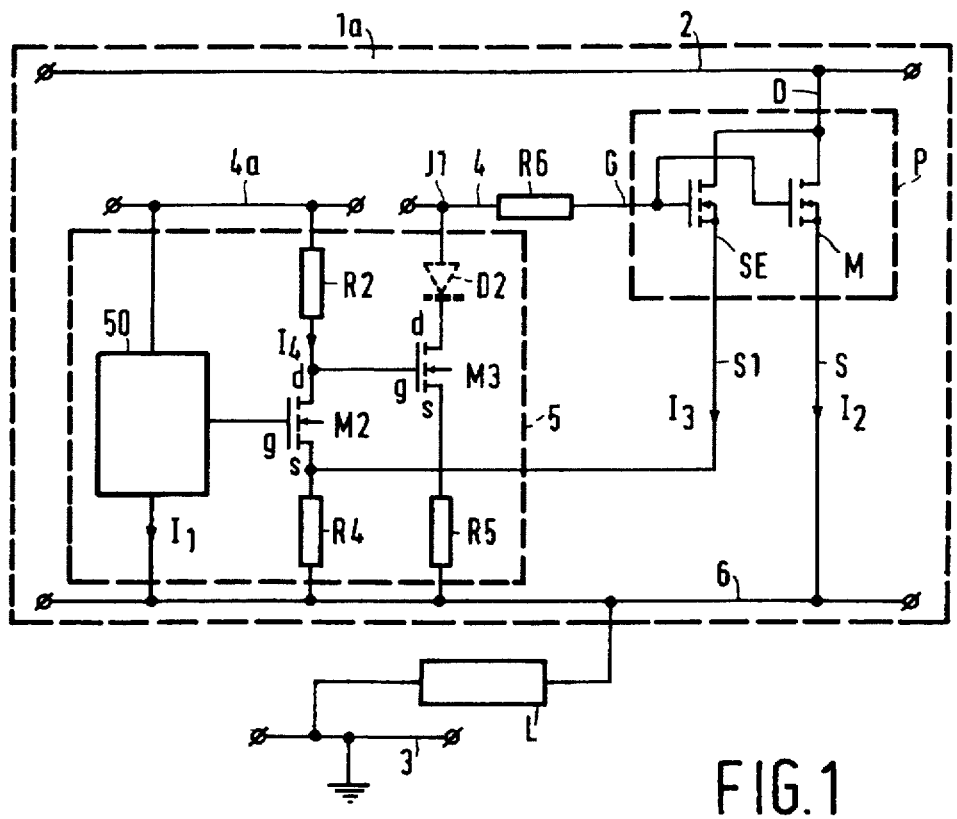
FIG. 1 shows a part block schematic circuit diagram of a protected switch in accordance with the invention.
Figure 2:
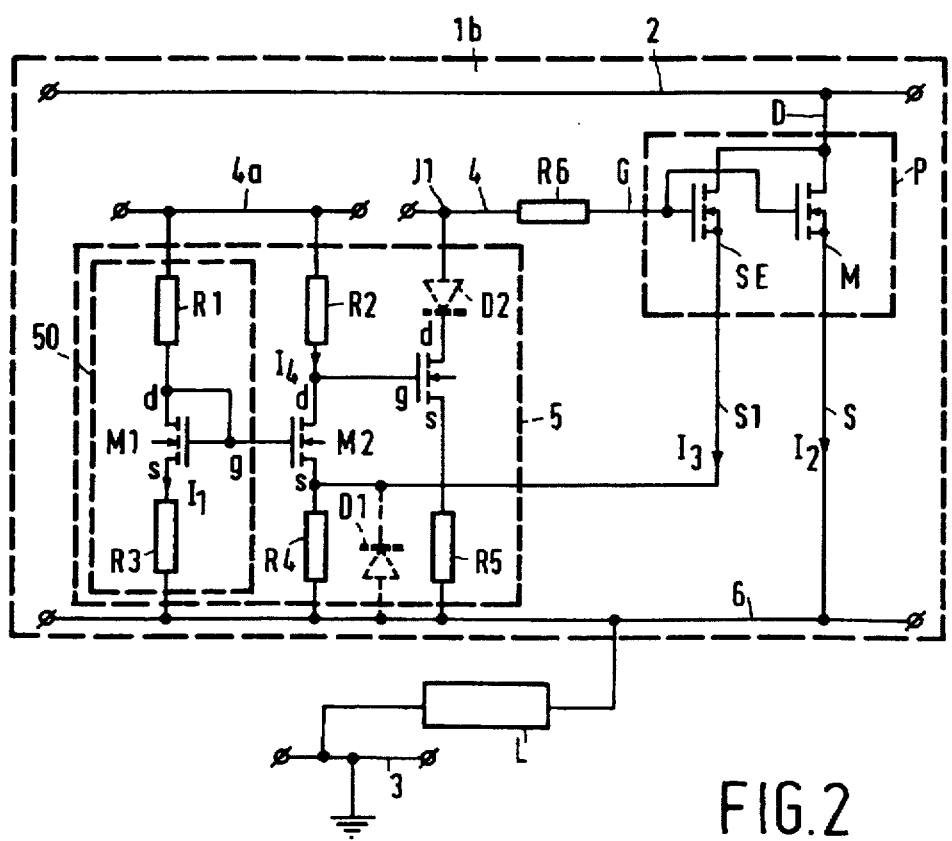
FIG. 2 shows a circuit diagram of one example of a protected switch in accordance with the invention.
Figure 5:
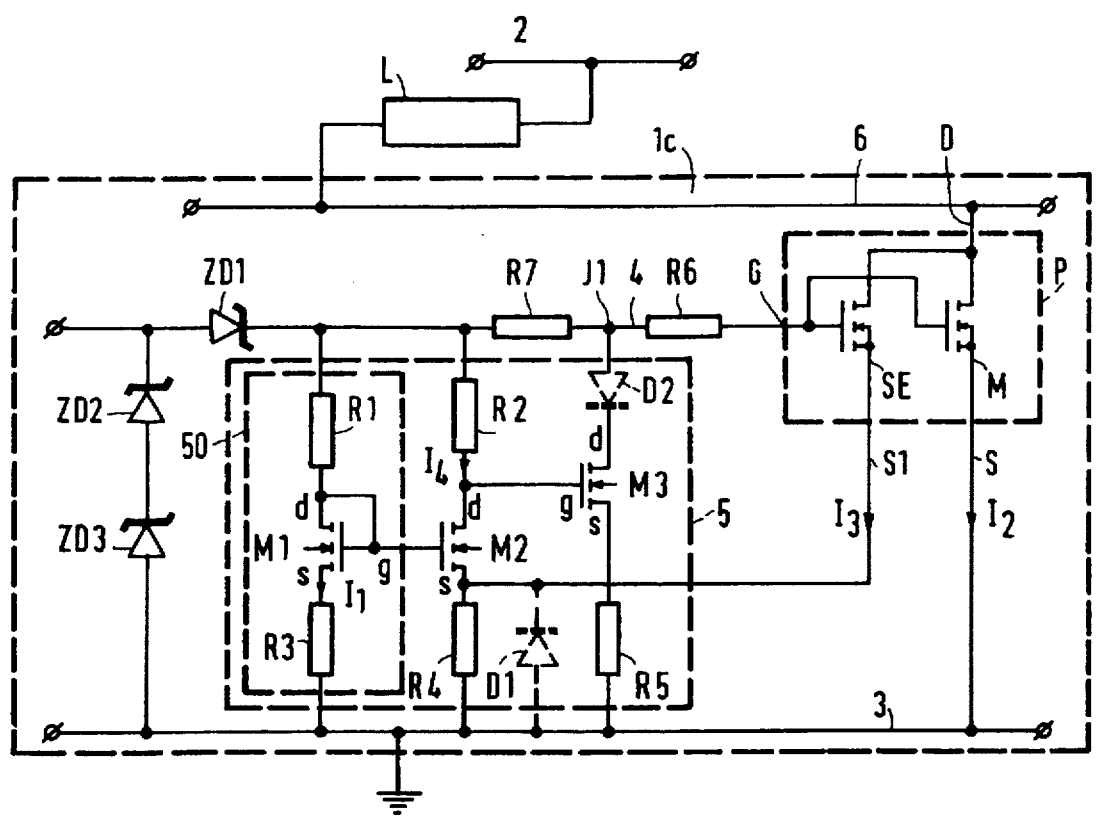
FIG. 5 shows a circuit diagram of another example of a protected switch in accordance with the invention.

Referring now to the drawings, especially FIGS. 1, 2, and 5 there are illustrated protected switches 1a, 1b, 1c each of which comprises a power semiconductor device P having first and second main electrodes D and S for coupling a load L between first 2 and second 3 voltage supply lines, a control electrode G coupled to a control voltage supply line 4 and a sense electrode S1 for providing in operation of the power semiconductor device P a current that flows between the first D and sense electrodes S1 and is indicative of the current that flows between the first D and second S main electrodes, and a control arrangement 5 comprising a sense resistance R4 coupled to the sense electrode S1 and across which a sense voltage is developed by the sense current $I_3$, a control semiconductor device M3 having first d and second s main electrodes coupled between the control electrode G and the second S main electrode of the power semiconductor device P and a control electrode g, a semiconductor device M2 having first and second main electrodes d and s and a control electrode g and having one d of its first and second main electrodes coupled to the control electrode g of the control semiconductor device M3 and the other s of its first and second main electrodes coupled to the sense resistance R4 and reference means 50 for providing a biasing voltage $V_b$ for the control electrode g of the semiconductor device M2 to cause the semiconductor device M2 to conduct sufficiently to cause the control semiconductor device M3 to be non-conducting until the sense voltage reaches a reference voltage $V_{ref}$ determined by the biasing voltage $V_b$ when the semiconductor device becomes less conducting and causes the control semiconductor device M3 to start to conduct, so reducing the voltage at the control electrode G of the power semiconductor device P and thus reducing the current through the power semiconductor device P.

A protected switch in accordance with the invention enables a higher gain to be achieved so that the regulated current of the power semiconductor device is less dependent on the series gate resistance or drive voltage of the power semiconductor device. Moreover, the occurrence of a negative resistance region can be avoided or at least inhibited and the other above mentioned problems with the protected switch described in U.S. Pat. No. 4,893,158 should be overcome or at least mitigated. Furthermore, because the sense electrode S1 may be coupled so that the semiconductor device does not have to carry the sense current there is no need for the biasing means and the semiconductor device to be formed so as to be able to carry high currents comparable with the sense current $I_3$. Moreover, in contrast to the protected switch described in U.S. Pat. No. 4,893,158, the sense resistance may be of a low value compared to the on state resistance of the sense current path.

Referring now specifically to the example shown in FIG. 1, in this case the power semiconductor device P comprises a power MOSFET which, as will be explained below, comprises a plurality of parallel-connected source cells. The power MOSFET has, in a manner similar to that described in EP-B-0139998 or U.S. Pat. No. 4,136,354, a main current carrying section M and a subsidiary or emulation current carrying section SE. The main current carrying section comprises a first plurality of parallel-connected source cells while the subsidiary current carrying section SE comprises a second plurality, smaller than the first plurality, of similar, generally identical, source cells. The main and subsidiary current carrying sections M and SE share a common first or drain electrode D and common gate or control electrode G. The source cells of the subsidiary current carrying section SE are not, however, coupled to the second main or source electrode S of the main current carrying section but are coupled to an auxiliary or sense electrode S1. As will be appreciated by those skilled in the art, this may be achieved by appropriate patterning of the source metallisation.

The drain electrode D of the power MOSFET P is coupled to a first voltage supply line 2 while the source electrode S of the power MOSFET P is coupled via a load L to a second voltage supply line 3. Generally, the first voltage supply line 2 will be coupled in operation to a positive voltage source while the second voltage supply line 3 will be coupled to earth or ground as shown. The load may be any suitable load, for example an inductive load such as a light or automobile lamp or even a motor to be controlled by the protected switch 1a.

The control or gate electrode G of the power MOSFET P is coupled to a control terminal 4 via, in this example, a resistor R6.

In the example shown in FIG. 1, the control semiconductor device of the control arrangement 5 comprises an enhancement mode insulated gate field effect transistor (hereinafter referred to simply as a transistor for simplicity) M3 having its first or drain electrode d coupled to a junction J1 between the control terminal 4 and the resistor R6. As indicated in phantom lines in FIG. 1, a diode D2 may be coupled between the drain electrode d of the transistor M3 and the gate control terminal 4, depending upon the voltage—withstanding characteristics of the transistor M3. The source electrode s of the transistor M3 is coupled via a resistor R5 to a connection line 6 coupled to the source electrode S of the power MOSFET P so as to increase the damping. Of course, if damping is not a problem, then the resistor R5 may be omitted.

In the example shown in FIG. 1, the semiconductor device also comprises an enhancement mode insulated gate field effect transistor M2 having its drain electrode d coupled to the control electrode g of the control transistor M3 and via a resistor R2 to an auxiliary voltage supply line 4a. The other, in this example the source, electrode of the transistor M2 is coupled via the sense resistance R4 to the connection line 6. The sense resistance may be formed from any suitable component providing the appropriate resistance and in this case comprises a resistor. The resistor R2, transistor M2 and sense resistor R4 effectively form a common gate amplifier.

The gate or control electrode g of the transistor M2 is coupled to the reference means 50 which is itself coupled between the auxiliary supply line 4a and the connection line 6. The reference means 50 may comprise any component suitable for providing the biasing voltage $V_b$ for the control electrode g of the transistor M2. The biasing voltage $V_b$ will normally be the reference voltage $V_{ref}$ plus the threshold voltage of the transistor M2.

As will be appreciated from the above, separate voltage supplies are provided for the gate control terminal 4 and the auxiliary voltage supply line 4a.

In operation of the protected switch 1a shown in FIG. 1, when appropriate voltages are applied to the supply lines 2, 3, 4 and 4a, the power MOSFET P will be rendered conducting so that the source electrode S supplies a current $I_2$ to the load L while the sense electrode S1 supplies the sense current $I_3$ to the sense resistor R4. The reference means 50 provides a current $I_1$ from which is derived the bias voltage $V_b$ for the gate or control electrode g of the transistor M2 so that the transistor M2 is normally on and the voltage at its first or drain electrode d is insufficient to turn on the control transistor M3. The current $I_4$ supplied via the resistor R2 to the transistor M2 is only sufficient to develop an extremely small voltage across the sense resistor R4. However, the sense current $I_3$ can develop a substantial sense voltage across the resistor R4. If the sense voltage developed by the sense current $I_3$ reaches, generally equals, the reference voltage $V_{ref}$ determined by the biasing voltage $V_b$, then the voltage drop across the sense resistor R4 results in the transistor M2 starting to conduct less so that the voltage at its drain electrode d rises causing the control transistor M3 to begin to conduct to limit the voltage at the control electrode g of the power semiconductor device and so to limit the current $I_2$ through the main section M of the power MOSFET P to, as a maximum, $$\left(\frac{V_{ref}}{r4}\right) \cdot K$$

where r4 is the value of the resistor R4 and K is the ratio between the number of cells in the main and sense current sections M and SE of the power semiconductor device P.

FIG. 2 shows one more detailed example of a protected switch 1b in accordance with the invention. In this case, the reference means 50 comprises a further semiconductor device in the form of an enhancement mode insulated gate field effect transistor M1. The first or drain electrode d of the transistor M1 is coupled to the auxiliary voltage supply line 4a via a resistor R1 while the second or source electrode s of the transistor M1 is coupled to the connection line 6 via a resistor R3. The resistor R3 may, for example, be a variable resistor so as to enable the reference voltage across the resistor R3 and thus the controlled or regulated current $I_2$ to be adjusted as desired. Generally, the resistors R1 and R2 will be of equal value and the resistors R1, R2 and R3 may, as will be discussed below, be diffused resistors while the resistor R4 may be a doped polycrystalline semiconductor resistor provided on an insulating layer over the semiconductor body within which the power MOSFET P is formed.

The use of a polycrystalline semiconductor, generally polycrystalline silicon, resistor for the resistor R4 should provide a very low temperature dependence, generally +0.1% per degree Kelvin. The reference voltage across the resistor R3 is almost independent of temperature but rises slightly with increase in temperature due to the decrease with temperature of the threshold voltage of the transistor M1. Accordingly, providing the sense resistor R4 so that it has a virtually zero or slightly positive temperature coefficient means that the sense current $I_3$ and the output current $I_2$ will have a low positive or compensated zero temperature coefficient. Polycrystalline silicon doped with $POCl_3$ to saturation has a temperature coefficient of about +0.12% per degree kelvin which should provide sufficient compensation to make the given current virtually independent of temperature. As indicated in phantom lines in FIG. 2, a diode D1 may be provided in parallel with the resistor R4, if necessary to act as a clamp to prevent excessive voltage differences between the source electrodes S and S1 of the main current carrying section M and the emulation current carrying section SE.

In this example, the gate electrode g of the control transistor M3 is coupled to the drain electrode of the second transistor M2 while the sense electrode S1 is coupled to the source electrode of the second transistor M2. This allows for a voltage gain $dI_d/dV_g(M2).R2$ to enable the use of a small value sense resistor R4 and a small sense voltage. The use of a very small sense voltage allows the ratio between the currents $I_2$ and $I_3$ to be almost equal to the ratio between the first plurality of source cells in the main current carrying section M and the second plurality of source cells in the subsidiary or sense current carrying section SE. This also allows for the transistors M1 and M2 to be small devices operating at low bias currents. The current in resistor R5 may be detected using any suitable means to obtain a logical indication of whether the current limiting function of the protected switch has been activated because, whenever the protected switch is actually limiting the current, then current will be shunted from the gate drive via resistor R5.

Although not shown in FIG. 2, appropriate resistances will be provided between the gate terminal 4 and the actual gate voltage supply. Also, as shown in FIG. 2, a resistance R6 is provided between the junction point J1 and the gate electrode G of the power MOSFET P.

In operation of the protected switch 1b shown in FIG. 2, when appropriate voltages are applied to the supply lines 2, 3, 4 and 4a, the power MOSFET P will be rendered conducting and the current $I_1$ will be supplied through the first transistor M1. The biasing voltage $V_b$ at the control electrode g of the second transistor M2 is established by the resistor R1, the first transistor M1 and the resistor R3 such that the second transistor M2 is normally on and the voltage at its first or drain electrode d is lower than that at the drain electrode d of the first transistor M1 and is insufficient to turn on the control transistor M3. The reference voltage $R_{ref}$ will be the biasing voltage $V_b$ minus the threshold voltage of the transistor M2 which is generally matched with the transistor M1. The current $I_4$ supplied via the resistor R2 is only sufficient to develop an extremely small voltage across the sense resistor R4. To take an example the voltage developed across the sense resistor R4 by the current $I_4$ may be, for example, 25 micro volts (μV). However, the sense current $I_3$ flowing through the sense current carrying section SE1 can apply a substantial voltage across the resistor R4. If the sense voltage developed by the sense current $I_3$ across the resistor R4 becomes almost equal to the voltage $V_{ref}$ across the resistor R3, the second transistor M2 starts to conduct less and accordingly the voltage at its first main electrode d rises. This will cause the control transistor M3 to begin to conduct to limit the voltage at the control electrode G of the power semiconductor device P so that the voltage across the resistor R4 is, approximately, no greater than the voltage across the resistor R3. To take a typical example, the value of the resistor R4 may be 5 Ohms, the bias voltage across the resistor R3 may be set to, for example, 75 mV and the protected switch 1b will operate to prevent the current $I_3$ from the sense current carrying section SE1 from exceeding 15 mA from a sense current carrying section comprising, for example, 6 or 7 device cells. The current $I_1$ may be 7.5 μA (microamps); if the value of the resistor R3 is 10 kilo-ohms, for example. The current $I_2$ flowing through the main current carrying section M will thus, in this example, be limited to 15 mA times the ratio W/L (M):W/L (SE1) between the width to length ratios of the main current carrying section M and the sense current carrying section SE.

Thus, the protected switch 1b shown in FIG. 2 uses a low resistance value sense resistor R4 and thus a small sense voltage. This sense voltage is in effect compared with the reference voltage $V_{ref}$ across the resistor R3 and the difference voltage multiplied by the gain $dI_d/dV_{gs}(M2).R2$ which may easily exceed 10. The control transistor M3 forms a simple inverter with the gate drive circuit as its load but the high gain from the control arrangement 5 means that a significant change to the gate drive requirements of the control transistor M3 is equivalent to only a very small change in the sensed voltage and hence in the sensed and output currents $I_3$ and $I_2$. The protected switch 1b also avoids or inhibits the problems of negative temperature coefficients for the given current and also enables the ratio between the current $I_2$ and the sense current $I_3$ to be more defined by the geometrical ratio K between the main and sense current carrying sections M and SE and to be more process independent. In addition, the circuit 1b should allow operation even when the drain/source voltage across the power semiconductor device P is quite low and should avoid or at least reduce the possibility of a negative resistance characteristic.

Typically, resistors R1 and R2 may have a resistance of about 500 Kilo Ohms while resistor R3 may have a resistance of 10 Kilo Ohms and be formed as a diffused resistor while, as indicated above, resistor R4 may have a resistance of 4 Ohms and be formed as a polycrystalline resistor.

Figure 3A:
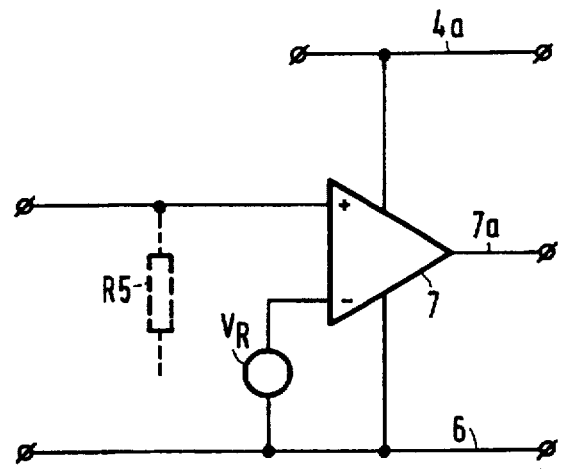
FIGS. 3a and 3b illustrate examples of circuits for detecting current.

FIG. 3a illustrates a circuit diagram of one possible arrangement for detecting the current through the resistor R5 which is shown in phantom lines in FIG. 3a. In the example shown in FIG. 3a, the resistor R5 is coupled to the positive input of a comparator 7 while the negative input of the comparator 7 is coupled to a suitable further reference voltage source $V_r$ with the comparator 7 providing at its output 7a an output signal indicating that the control transistor M3 is conducting and thus that current is passing through the resistor R5 when the voltage developed across the resistor R5 by the current through the resistor R5 exceeds that of the further reference voltage source $V_r$. The comparator 7 may be coupled between any appropriate pair of voltage supply lines, for example the auxiliary voltage supply line 4a and the connection line 6.

Figure 3B:
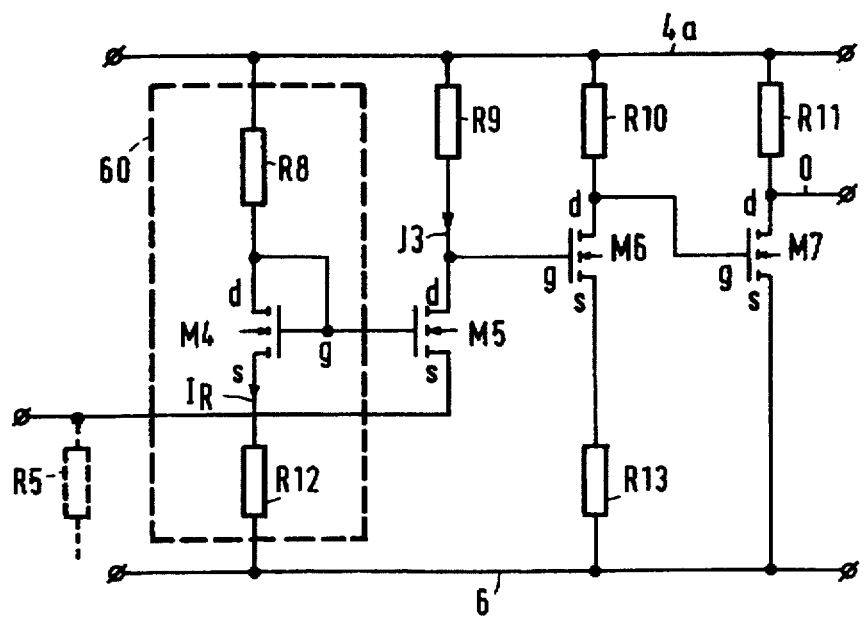

FIG. 3b illustrates another possible form of circuit for detecting the activation of the control transistor M3 by detecting the current through the resistor R5.

In the example shown in FIG. 3b, a circuit similar to the control arrangement 5 is used to detect current flowing through the resistor R5. Thus, the resistor R5 is coupled to one of the first and second main electrodes s of a semiconductor device in the form, in this example, of an n channel enhancement mode insulated gate field effect transistor M5. The other main electrode d of the transistor M5 is coupled via a resistor R9 to one voltage supply line which may be, for example, the auxiliary voltage supply line 4a. The control or gate electrode g of the transistor M5 is coupled to reference means 60 which, like the reference means 50, provides a further biasing voltage from which the further reference voltage is derived. The reference means 60 operates in the same manner as the reference means 50 and may be of any of the forms suitable for the reference means 50. In the example shown in FIG. 3b, the reference means 60 comprises a further semiconductor device in the form of an n channel enhancement mode insulated gate field effect transistor M4 which has its control electrode g coupled to the control electrode g of the transistor M5 and to its drain electrode which is itself coupled via a resistor R8 to the voltage supply line 4a. The other main electrode s of the transistor M4 is coupled via a resistor R12 to the other voltage supply line 6. The further reference voltage $V_R$ is developed across the resistor R12 by the current $1_R$.

The junction J3 between the resistor R9 and the drain electrode d of the transistor M5 is coupled to the control or gate electrode of another semiconductor device again in the form of an n channel enhancement mode insulated gate field effect transistor M6 having its drain electrode d coupled to the control or gate electrode of another semiconductor device in the form of an n channel enhancement mode insulated gate field effect transistor M3 and via a resistor R10 to the voltage supply line 4a.

The source electrode s of the transistor M6 is coupled via a resistor R13 to the other voltage supply line 6 while the drain electrode d of the transistor M7 is coupled to an output line O and via a resistor R11 to the voltage supply line 6. In this example, the source electrode s of the transistor M7 is coupled directly to the other voltage supply line 6. The two inverter stages provided by the transistors M6 and M7 effectively provide an output gain stage for the detecting circuit shown in FIG. 3b.

The circuit shown in FIG. 3b operates in a similar manner to the control arrangement 5. Thus, the reference means 60 establishes the further biasing voltage at the control electrode g of the transistor M5 so that the transistor M5 is normally on and the voltage at its first or drain electrode d is lower than that at the drain electrode d of the transistor M4 and is insufficient to turn on the transistor M6. The further reference voltage is established across the resistor R12 by the current $I_R$. When the transistor M3 (see FIG. 2) is rendered conducting by virtue of the voltage developed across the sense resistor R4 by sense current $I_3$ approaching the reference voltage $V_{ref}$, the current through the resistor R5 produces a voltage drop across the resistor R5 which reaches, generally equals, the voltage $V_R$ across the resistor R12 causing the transistor M5 to start to conduct less so that the voltage at its first main electrode d rises causing the transistor M6 to conduct lowering the voltage at its drain electrode d and thus rendering the transistor M7 non-conducting so that a high output signal is provided on the output line O providing an indication that the control transistor M3 is active and that the current through the power MOSFET P is being limited by the control arrangement 5.

Of course, any other suitable means for detecting the activation of the control transistor M3 may be used.

Figure 4A:
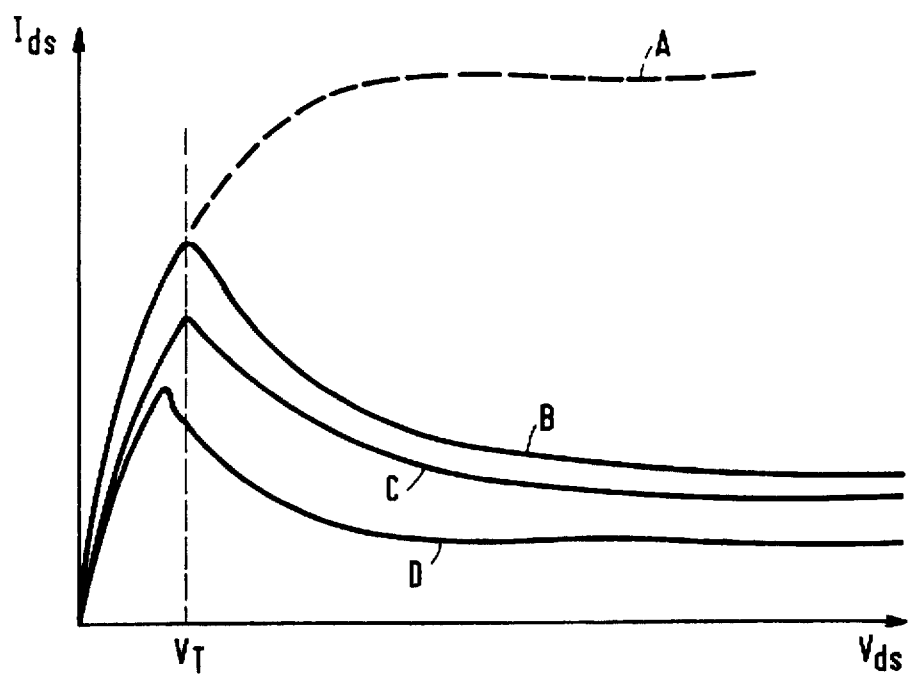
FIGS. 4a and 4b illustrate graphs of drain current $I_{ds}$ against drain voltage $V_{ds}$ for a known protected switch and for a protected switch such as that shown in FIG. 2 respectively.
Figure 4B:
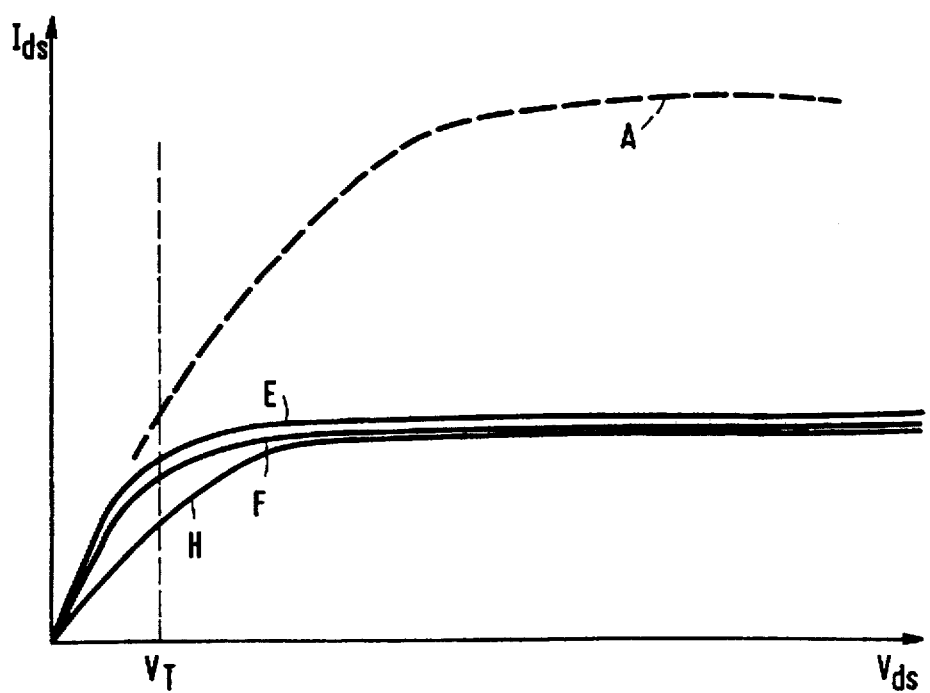

The effect of the protected switch 1b in operation can be more clearly seen from a comparison of FIGS. 4a and 4b which both show graphs of drain-source current $I_{ds}$ against drain source voltage $V_{ds}$. FIG. 4a illustrates the situation for a protected switch such as that described in U.S. Pat. No. 4,893,158 while FIG. 4b illustrates the situation for a protected switch similar to that shown in FIG. 2. In each case the dashed line A illustrates the relationship between the drain-source current and voltage when the control arrangement of the protected switch is either omitted or is not functional. Thus the dashed curve A illustrates the normal operation of a power MOSFET without current limiting. In FIG. 4a, the solid line B illustrates the characteristic obtained when the control arrangement of a protected switch such as that shown in U.S. Pat. No. 4,893,158 is effective to limit the drain-source current under typical operating conditions while the line C illustrates the situation where the power MOSFET is operating with a reduced gate drive voltage and the line D illustrates the situation where the power MOSFET is running hot (at a temperature of 150° C.). Lines E, F and H illustrate the characteristics for equivalent conditions with the protected switch 1b shown in FIG. 2. Thus, the line E in FIG. 4b shows the typical operation of the protected switch 1b to limit the drain source current $I_{ds}$, the line F shows the operation with a reduced drive to the gate electrode G of the power MOSFET P and the line H shows the characteristic when the power MOSFET is running hot (150° C.).

The long dashed line in FIG. 4a illustrates the threshold voltage $V_T$ of the control transistor of a protected switch such as that described in U.S. Pat. No. 4,893,158. This voltage will typically be of the order of 1 to 2 volts. As can be seen by comparing FIGS. 4a and 4b, the prior art protected switch shows in each of the characteristics B, C and D a marked negative resistance region whereas such a negative resistance region is absent from the characteristics E, F and H of a protected switch in accordance with the invention. Moreover, as explained above, the current through the power semiconductor device and the current supplied through the relatively high value sense resistor $R_s$ of the prior art protected switch will both be a function of process-dependent electrical parameters of the power semiconductor device and the control or sense cell arrangement as well as their geometrical ratio because the main section of the power semiconductor device and the sense section will be operating with dissimilar voltages between their control and second main electrodes and between their first and second main electrodes. Accordingly, the regulated or limited current through the power MOSFET of the prior circuit will be considerably greater than the corresponding sense current $I_s$ multiplied by the geometric ratio K (that is the ratio between the number of main power device cells and the number of sense cells). In contrast, in a protected switch in accordance with the invention the regulated or limited current will be approximately equal to the sense current $I_3$ multiplied by the geometric ratio K. Accordingly, the current through the power semiconductor device can be regulated more precisely using a protected switch in accordance with the present invention.

FIG. 5 illustrates a further example of a protected switch 1c in accordance with the invention. In this example, the protected switch 1c is a low-side switch, that is the load L is coupled between the drain electrode D of the power MOSFET and the positive voltage supply line 2.

In FIG. 5, the control arrangement 5 is similar to that shown in FIG. 2 and again comprises transistor M3 and the transistors M1 and M2 each associated with their respective resistors R1 and R3 and R2 and R4. In this case, however, the voltage supply line for the control arrangement 5' is not a separate auxiliary voltage supply line but comprises the power MOSFET P gate voltage supply line so that the control arrangement 5 is coupled between the gate terminal 4 and the second voltage supply line 3. A further resistor R7 may be coupled between the resistor R2 and the optional diode D2 in the path to the gate terminal G as shown in FIG. 5. A protective zener diode ZD1 may be coupled between the resistor R1 and the gate or control voltage terminal 4 to prevent or at least inhibit parasitic bipolar emitter current for negative input currents.

Of course, the values of the various components will depend on the actual circuit concerned and although resistors may have the same reference numbers in FIGS. 2 and 5 they need not necessarily in practice have the same resistance values. The resistor R6 and the optional diodes D1 and D2 may be formed as polycrystalline semiconductor devices on an insulating layer over the semiconductor body within which the power semiconductor device P is formed. Forming the diodes D1 and D2 as polycrystalline semiconductor devices has the advantage of avoiding the parasitic bipolar transistor problems inherent in the use of diffused diodes and resistors. As shown in FIG. 5, two zener diodes ZD2 and ZD3 may be coupled between the gate voltage supply terminal 4 and the source electrode S so as to provide protection of the gate dielectric against over-voltages on the gate terminal. Of course, any other suitable electrostatic discharge (ESD) protection may be provided and similar protection may be provided in the examples of FIGS. 1 and 2.

Although the resistor R5 is absent from FIG. 5 it could be provided and means similar to those shown in FIGS. 3a and 3b may be used to detect the current through the resistor R5 to detect activation of the current limiting. The protected switch 1c shown in FIG. 5 operates in a manner similar to that of the protected switch 1b shown in FIG. 2.

In any of the examples described above, the protected switch may be of integrated form with one or more of the components being formed within the same semiconductor body as the power MOSFET P and one or more of the components possibly being formed on top of an insulating layer covering the semiconductor body within which the power MOSFET P is formed.

Figure 6:
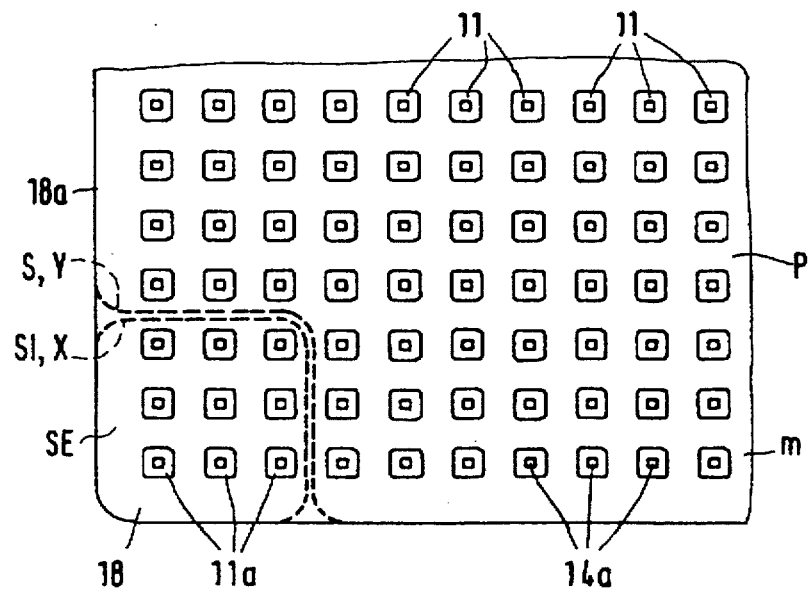
FIG. 6 shows a plan view of part of a semiconductor body carrying a protected switch such as that shown in FIGS. 1, 2 or 5.

FIGS. 6 and 7 illustrate by way of a plan view and cross-sectional views, respectively, of different parts of a semiconductor body 10 how different components which may be used to form a protected switch such as that shown in FIGS. 1, 2 and 5 may be formed.

The semiconductor body 10 comprises, in this example, a relatively highly doped n conductivity single crystal silicon substrate 10a on which is provided a relatively lowly doped n conductivity type silicon epitaxial layer 10b which forms the first region, generally the drain drift region, of the MOSFET P.

Figure 7A:
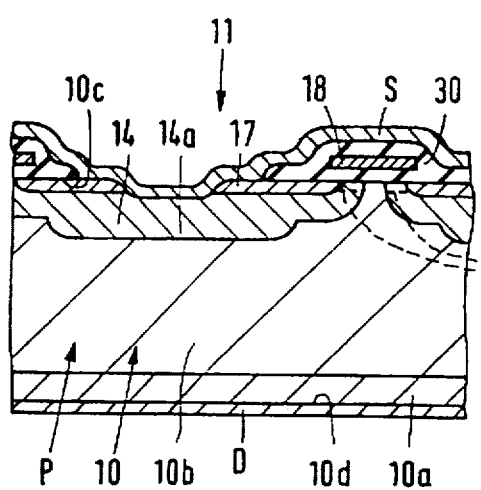
FIGS. 7a to 7f are cross-sectional views through parts of the semiconductor body for illustrating one possible structure for the various components of a protected switch such as that shown in FIGS. 1, 2 or 5.

FIG. 6 illustrates a top plan view of part of the semiconductor body 10 within which the main current carrying section M and the sense current carrying section SE of the power semiconductor device P, in this case a power MOSFET, are formed. In order to show the structure of the power MOSFET P more clearly, the source, sense and gate electrode metallisation have been omitted from FIG. 6. As can be seen clearly from FIG. 6, the power MOSFET P comprises a plurality of source cells 11 formed using conventional DMOS processing technology. FIG. 7a shows a cross-sectional view through part of one cell 11 of the MOSFET P. The cell 11 comprises adjacent one major surface 10c of the semiconductor body 10a p conductivity body region 14 which contains an n conductivity source region 17 and defines therewith a conduction channel area 14b under the insulated gate 18 of the MOSFET P. As shown, the p body region 14 may have a central relatively highly doped subsidiary region 14a which is shorted (either as shown by a moat etched through the source region 17 or by masking the source implant) to the source electrode S to inhibit parasitic bipolar action. The source electrode S, sense electrode S1 (not shown) and gate electrode G (not shown) are formed by metallisation provided on top of an insulating layer 30 and making contact to the source regions 17 and insulated gate 18, respectively, via appropriate contact holes. The drain electrode D is provided on the other major surface 10d of the semiconductor body 10.

Typically the power MOSFET P may consist of many hundreds or thousands of source cells 11. The periphery 18a of the insulated gate 12 may, as is usual, extend up onto surrounding field oxide (not shown) and, although not shown, conventional edge terminations such as Kao's rings and/or field plates may be provided at the periphery of the power MOSFET P.

The sense current carrying section SE comprises a number of the source cells 11 separated from the main current carrying section M by the definition of the metallisation (not shown in FIG. 4) to form the source electrode S and the sense electrode S1. The dashed lines x and y in FIG. 6 are intended to represent the respective adjacent boundaries of the sense electrode S1 and the source electrode S. Although FIG. 6 shows the sense current carrying section SE as being formed of nine source cells at a corner of the power MOSFET P, the actual number of source cells 11 forming the sense current carrying section SE and the location of the sense current carrying section SE within the power MOSFET P may be somewhat different. Thus, for example, the sense current carrying section SE could be formed by a single narrow row of source cells 11 to which the sense electrode SI makes contact by passing over an uncontacted dead or dummy cell which contains no source region and which may partly overlap a surrounding peripheral guard region of the power MOSFET P. Such an arrangement may ensure that the sense source cells 1 a are surrounded on average on two sides by cells of the main current carrying section M to ensure better matching in terms of process topography and thermal environment.

Figure 7B:
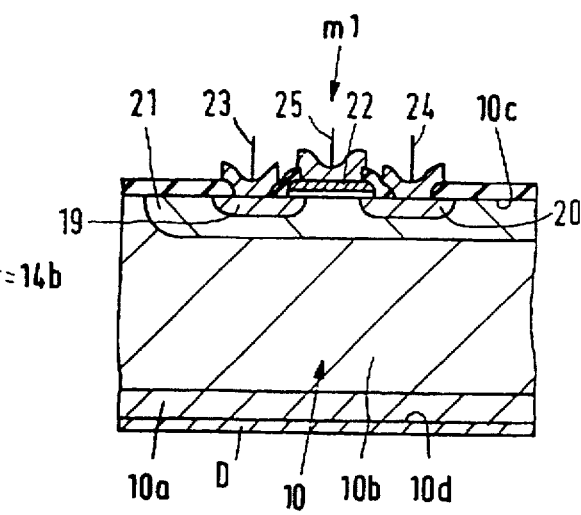

FIG. 7b shows enhancement mode lateral NMOS transistor which may be used for forming the transistors M1 to M7, for example the transistor M1 mentioned above. As shown in FIG. 7b, the transistor M1 has source and drain regions 19 and 20 diffused in a p conductivity second region which in this example forms an isolation or well region 21 and an overlying insulated gate 22 and source, gate and drain electrodes 23, 24 and 25 formed on the insulating layer 30.

Figure 7C:
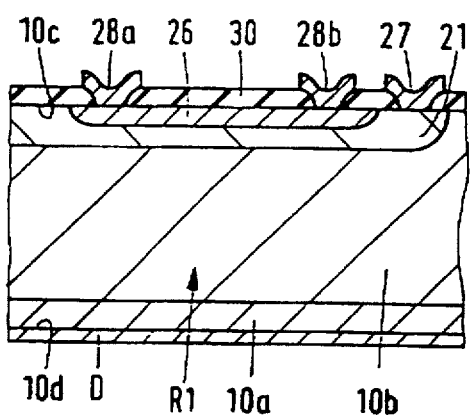

FIG. 7c shows a diffused resistor, for example the resistor R1, which consists of an n conductivity region 26 within a p conductivity well or isolation region which may be the same region 21. An electrode 27 couples the well region 21 to a reference potential which is generally ground and resistor electrodes 28a and 28b are provided at each end of the region 26.

Figure 7D:
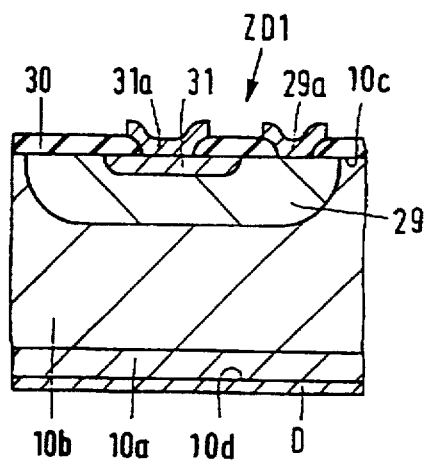

FIG. 7d shows a diffused diode, for example the zener diode ZD1 consisting of a relatively highly doped p conductivity region 29 within which is provided an n conductivity region 31 together with appropriate electrodes 29a and 31a making contact through contact holes in the insulating layer 30.

Figure 7E:
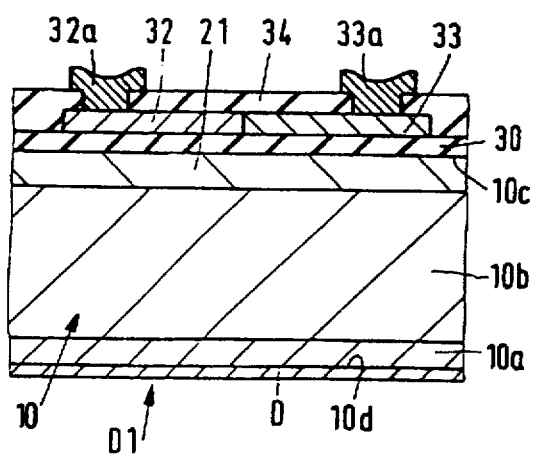
Figure 7F:
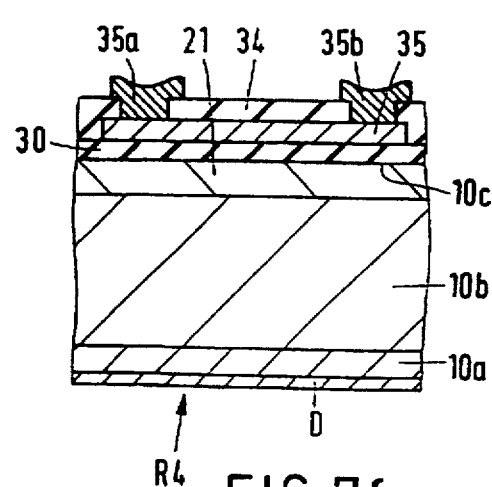

FIG. 7e shows a thin film diode, for example, D1 while FIG. 7f shows a thin film resistor, for example R4, formed on top of the insulating layer 30, usually over the well region 21. As shown, the diode D1 is a pn junction diode consisting of oppositely doped regions 32 and 33 of polycrystalline silicon with respective electrodes 32a and 33a making contact through openings in an insulating layer 34 while the resistor R4 is generally formed by an n conductivity doped polycrystalline silicon region 35 with respective electrodes 35a and 35b making contact through openings in the insulating layer 34.

Although in some of the embodiments described above, the power semiconductor device has been shown as a high side switch, that is coupled between the positive voltage supply line and the load and in some as a low side switch with the power semiconductor device coupled between the more negative voltage (generally earth or ground) supply line and the load, it will be appreciated that each of the described circuits could be used for either configuration.

Of course, the conductivity types and polarities given above may be reversed and the semiconductor body may be formed of a semiconductor other than silicon, for example germanium or a combination of semiconductor materials or a III-V semiconductor material. In addition, the power semiconductor device may be other than a power MOSFET and could be, for example, formed as an IGBT simply by reversing the conductivity type of the region 21 in FIGS. 5 and 6 (provided, of course, that any problems with inherent parasitic bipolar devices can be avoided). Also, the present invention may be applied to other types of power semiconductor devices in which the current supplied by a sense electrode is indicative of that between the first and second main electrodes of the power semiconductor device, for example a power bipolar device such as a power bipolar transistor.

Although the above embodiments describe certain components as being carried by the semiconductor body as diffused components, any of the components other than the power semiconductor device may be carried by the semiconductor body by being formed on an insulating layer provided over the power semiconductor device and may be, for example, amorphous or polycrystalline semiconductor thin film components. Of course, the various components need not necessarily be integrated with the power semiconductor device but may be separate discrete components or integrated together separately from the power semiconductor device in a separate semiconductor body or on a separate substrate.

From reading the present disclosure, other modifications and variations will be apparent to persons skilled in the art. Such modifications and variations may involve other features which are already known in the art and which may be used instead of or in addition to features already described herein. Although claims have been formulated in this application to particular combinations of features, it should be understood that the scope of the disclosure of the present application also includes any novel feature or combination of features disclosed herein either explicitly or implicitly, whether or not relating to the same invention as presently claimed in any claim and whether or not it mitigates any or all of the same technical problems as does the presently claimed invention. The applicants hereby give notice that new claims may be formulated to such features and/or combinations of such features during prosecution of the present application or of any further application derived therefrom.

We claim:

1. A protected switch comprising a power semiconductor device having first and second main electrodes for coupling a load between first and second voltage supply lines, a control electrode coupled to a control voltage supply line, and a sense electrode for providing in operation of the power semiconductor device a sense current that flows along a sense current path between the first and sense electrodes and is indicative of the current that flows between the first and second main electrodes, the sense current path having an on-state resistance in operation of the power semiconductor device, the switch further comprising a control arrangement comprising a sense resistance coupled to the sense electrode and across which a sense voltage is developed by the sense current, the sense resistance having a lower resistance value than the on-state resistance of the sense current path, a control semiconductor device having first and second main electrodes coupled between the control electrode and the second main electrode of the power semiconductor device and a control electrode, a further semiconductor device having first and second main electrodes and a control electrode, one of said first and second main electrodes being coupled to the sense resistance, and the other of said first and second main electrodes being directly coupled to the control electrode of the control semiconductor device, and voltage-bias reference means coupled to the control electrode of said further semiconductor device for providing a biasing voltage for the control electrode of said further semiconductor device to cause said further semiconductor device to conduct sufficiently to cause the control semiconductor device to be non-conducting until the sense voltage reaches a reference voltage determined by the biasing voltage when said further semiconductor device becomes less conducting and causes the control semiconductor device to start to conduct, thereby reducing the voltage at the control electrode of the power semiconductor device and thus reducing the current through the power semiconductor device.

2. A protected switch according to claim 1, wherein the control arrangement is integrated with the power semiconductor device in and on a semiconductor body, the sense resistance being a thin film resistor provided on an insulating layer on the semiconductor body.

3. A protected switch comprising a power semiconductor device having first and second main electrodes for coupling a load between first and second voltage supply lines, a control electrode coupled to a control voltage supply line and a sense electrode for providing in operation of the power semiconductor device a sense current that flows between the first and sense electrodes and is indicative of the current that flows between the first and second main electrodes, and a control arrangement comprising a sense resistance coupled to the sense electrode and across which a sense voltage is developed by the sense current, a control semiconductor device having first and second main electrodes coupled between the control electrode and the second main electrode of the power semiconductor device and a control electrode, wherein the control arrangement also comprises a semiconductor device having first and second main electrodes and a control electrode and having one of said first and second main electrodes coupled to the control electrode of the control semiconductor device and the other of its first and second main electrodes coupled to the sense resistance, and reference means for providing a biasing voltage for the control electrode of the semiconductor device to cause the semiconductor device to conduct sufficiently to cause the control semiconductor device to be non-conducting until the sense voltage reaches a reference voltage determined by the biasing voltage when the semiconductor device becomes less conducting and causes the control semiconductor device to start to conduct, so reducing the voltage at the control electrode of the power semiconductor device and thus reducing the current through the power semiconductor device, wherein the reference means comprises a further semiconductor device having first and second main electrodes and a control electrode, the control electrode of the further semiconductor device being coupled to one of the first and second main electrodes of the further semiconductor device and to the control electrode of the semiconductor device, and wherein the other of the first and second main electrodes of the further semiconductor device is coupled via a first resistance to an auxiliary voltage supply line separate from the control voltage supply line, the one main electrode of the semiconductor device is coupled to the auxiliary voltage supply line by a second resistance, and the other one of the first and second main electrodes of the semiconductor device and the further semiconductor device are coupled by the sense resistance and a third resistance, respectively, to the second main electrode of the power semiconductor device.

4. A protected switch according to claim 3, wherein the semiconductor device and the further semiconductor device comprise transistors.

5. A protected switch according to claim 3, comprising a semiconductor body, in and on which the control arrangement is integrated with the power semiconductor device.

6. A protected switch according to claim 3, wherein the power semiconductor device comprises a first plurality of device cells coupled in parallel between the first and second main electrodes and a second smaller plurality of similar device cells coupled in parallel between the sense electrode and the first main electrode of the power semiconductor device.

7. A protected switch according to claim 3, wherein the power semiconductor device comprises a power MOSFET.

8. A protected switch according to claim 3, wherein the sense resistance is a thin film resistor provided on an insulating layer on the semiconductor body.

9. A protected switch comprising a power semiconductor device having first and second main electrodes for coupling a load between first and second voltage supply lines, a control electrode coupled to a control voltage supply line and a sense electrode for providing in operation of the power semiconductor device a sense current that flows between the first and sense electrodes and is indicative of the current that flows between the first and second main electrodes, and a control arrangement comprising a sense resistance coupled to the sense electrode and across which a sense voltage is developed by the sense current, a control semiconductor device having first and second main electrodes coupled between the control electrode and the second main electrode of the power semiconductor device and a control electrode, wherein the control arrangement also comprises a semiconductor device having first and second main electrodes and a control electrode and having one of said first and second main electrodes coupled to the control electrode of the control semiconductor device and the other of its first and second main electrodes coupled to the sense resistance, and reference means for providing a biasing voltage for the control electrode of the semiconductor device to cause the semiconductor device to conduct sufficiently to cause the control semiconductor device to be non-conducting until the sense voltage reaches a reference voltage determined by the biasing voltage when the semiconductor device becomes less conducting and causes the control semiconductor device to start to conduct, so reducing the voltage at the control electrode of the power semiconductor device and thus reducing the current through the power semiconductor device, and wherein means are coupled to the control semiconductor device for detecting when the control semiconductor device is conducting.

10. A protected switch according to claim 9, wherein the reference means comprises a further semiconductor device having first and second main electrodes and a control electrode, the control electrode of the further semiconductor device being coupled to one of the first and second main electrodes of the further semiconductor device and to the control electrode of the semiconductor device.

11. A protected switch according to claim 9, wherein the detecting means comprises a detecting resistance coupled in series with the control semiconductor device and means for comparing the voltage across the detecting resistance with a further reference voltage.

12. A protected switch according to claim 11, wherein the comparing means comprises another semiconductor device having one of its first and second main electrodes coupled to the control gate of an output semiconductor device and the other of its first and second main electrodes coupled to the detecting resistance and further reference means for providing a further biasing voltage for the control electrode of the said other semiconductor device causing the said other semiconductor device to conduct sufficiently for the output semiconductor device to be non-conducting until the voltage across the detecting resistance reaches said further reference voltage determined by the further biasing voltage when the said other semiconductor device becomes less conducting and causes the output semiconductor device to start to conduct so providing a signal indicating that the control semiconductor device is conducting.

13. A protected switch according to claim 9, comprising a semiconductor body, in which the control arrangement is integrated with the power semiconductor device.

14. A protected switch according to claim 13, wherein the power semiconductor device comprises a first plurality of device cells coupled in parallel between the first and second main electrodes and a second smaller plurality of similar device cells coupled in parallel between the sense electrode and the first main electrode of the power semiconductor device.

15. A protected switch according to claim 13, wherein the power semiconductor device comprises a power MOSFET.

16. A protected switch according to claim 13, wherein the sense resistance is a thin film resistor provided on an insulating layer on the semiconductor body.

* * * * *